(12) United States Patent
Chao et al.

(10) Patent No.: US 9,547,030 B2
(45) Date of Patent: Jan. 17, 2017

(54) METHOD OF RECOGNIZING TOUCH

(71) Applicant: TIANJIN FUNAYUANCHUANG TECHNOLOGY CO., LTD., Tianjin (CN)

(72) Inventors: Li-Min Chao, New Taipei (TW); Chien-Yung Cheng, New Taipei (TW); Po-Sheng Shih, New Taipei (TW)

(73) Assignee: TIANJIN FUNAYUANCHUANG TECHNOLOGY CO., LTD., Tianjin (CN)

( * ) Notice: Subject to any disclaimer, the term of this patent is extended or adjusted under 35 U.S.C. 154(b) by 570 days.

(21) Appl. No.: 14/147,582

(22) Filed: Jan. 5, 2014

(65) Prior Publication Data

US 2015/0032395 A1  Jan. 29, 2015

(30) Foreign Application Priority Data

Jul. 24, 2013 (CN) .......................... 2013 1 0313126

(51) Int. Cl.
*G01R 25/00* (2006.01)
*G01R 27/26* (2006.01)
*G06F 3/041* (2006.01)

(52) U.S. Cl.
CPC ......... *G01R 27/2605* (2013.01); *G06F 3/0416* (2013.01)

(58) Field of Classification Search
CPC ...... G06F 3/044; G06F 3/0412; G06F 3/0416; G06F 2203/04103; G06F 3/047; G06F 2203/04112; G06F 3/0488; G06F 2203/04111; G06F 3/016; G06F 3/04842; G06F 3/041; G06F 3/0418; G06F 3/03545; G06F 11/00
See application file for complete search history.

(56) References Cited

U.S. PATENT DOCUMENTS

2012/0162105 A1* 6/2012 Sakurai ................. G06F 3/0488
345/173
2012/0256877 A1* 10/2012 Lin ......................... G06F 3/044
345/174

* cited by examiner

*Primary Examiner* — Roy Y Yi
(74) *Attorney, Agent, or Firm* — Zhigang Ma

(57) ABSTRACT

The disclosure relates to a method for recognizing touch. A first value $T_1$ and a second value $T_2$ are set. A number of first sensing values $C_1$ are obtained. $C_1$ is compared with $T_1$ and $T_2$. When $C_1$ is greater than or equal to $T_1$, a touch with finger is recognized. When $C_1$ is smaller than $T_2$, no touch is recognized. When $C_1$ are greater than or equal to $T_2$ and smaller than $T_1$, following steps are taken. A third value $T_3$ is set. At least three driving electrodes are driven and a number of second sensing values $C_2$ are obtained. A number of maximum sensing values $C_{2peak}$ are selected from the $C_2$ and compared with $T_3$. When $C_{2peak}$ are greater than or equal to $T_3$, a touch with glove is recognized. And when not, no touch is recognized.

6 Claims, 4 Drawing Sheets

| 0 | 0 | 2 | -4 | -6 | 1 | 0 |
|---|---|---|----|----|---|---|
| 1 | 1 | 3 | 7 | 2 | 4 | 0 |
| 1 | 1 | 7 | 22 | 14 | 6 | 2 |
| 5 | 3 | 12 | 45 | 36 | 13 | 3 |
| 6 | 4 | 16 | 77 | 70 | 17 | 4 |
| 7 | 5 | 22 | 100 | 93 | 19 | 6 |
| 4 | 3 | 13 | 63 | 59 | 12 | 4 |
| 4 | 2 | 6 | 22 | 20 | 8 | 1 |
| 3 | 1 | 4 | 16 | 11 | 4 | 1 |
| 3 | 1 | 2 | -2 | -4 | 1 | 0 |
| 2 | 1 | -1 | -6 | -8 | 2 | -1 |

FIG. 4

METHOD OF RECOGNIZING TOUCH

This application claims all benefits accruing under 35 U.S.C. §119 from China Patent Application No. 201310313126.X, filed on Jul. 24, 2013 in the China Intellectual Property Office, the contents of which are hereby incorporated by reference.

BACKGROUND

1. Technical Field

The present disclosure relates to a method of recognizing touch on a touch panel and particularly a method of recognizing touch on a capacitive touch panel.

2. Description of Related Art

In recent years, various electronic apparatuses such as mobile phones, car navigation systems have advanced toward high performance and diversification. There is continuous growth in the number of electronic apparatuses equipped with optically transparent touch panels in front of their display devices such as liquid crystal panels. A user of such electronic apparatus operates it by pressing a touch panel with a finger or a stylus while visually observing the display device through the touch panel.

According to working principle and transmission medium, touch panel has four types of resistance, capacitance, infra-red, and surface acoustic-wave. Capacitive touch panel has been widely used for its higher sensitivity and lower touch pressure required.

Working principle of capacitive touch panel is as follows: distribution of capacitance on the touch panel is changed by a finger touch, the change of distribution of capacitance is detected and a touch position is obtained. However, if the finger is coated by an insulator such as gloves, the touch can not be recognized, thereby causing inconvenience to users.

What is needed, therefore, is a method of recognizing touch that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

FIG. 4 is a view of signal values of a touch panel detected by an integrated circuit (IC).

DETAILED DESCRIPTION

The disclosure is illustrated by way of example and not by way of limitation in the fingers of the accompanying drawings in which like references indicate similar elements. It should be noted that references to "an" or "one" embodiment in this disclosure are not necessarily to the same embodiment, and such references mean at least one.

Figure 1:
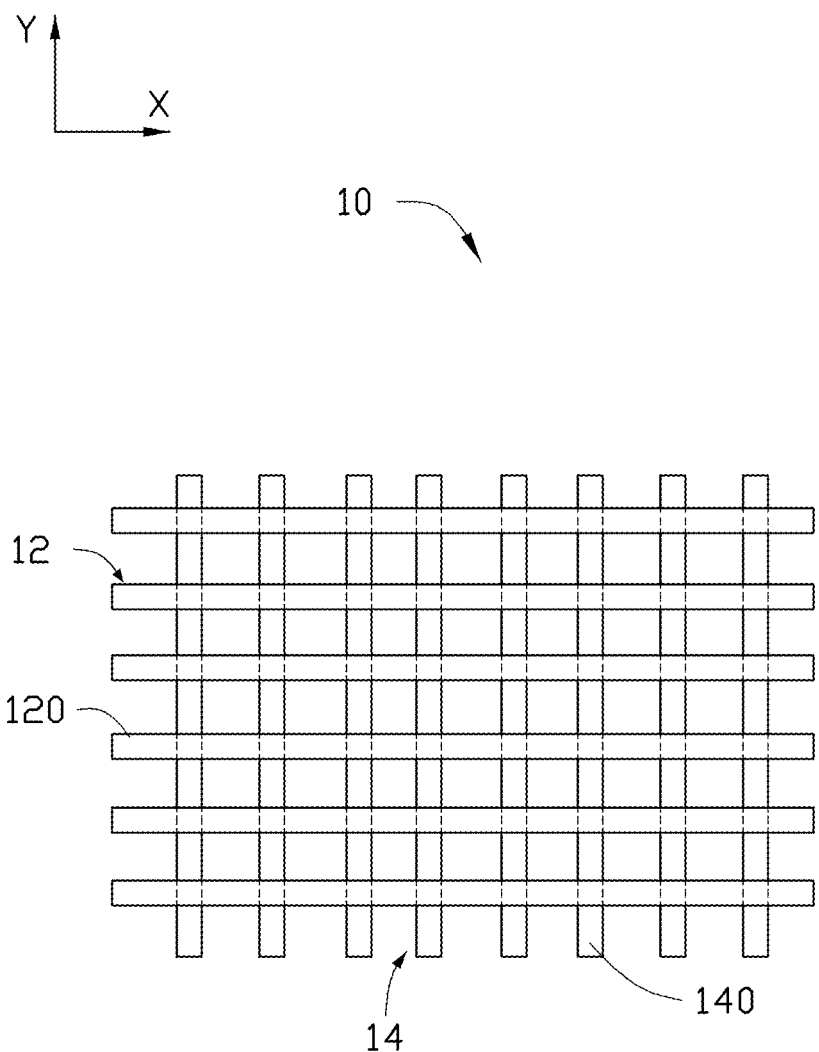
FIG. 1 is a structure view of a touch panel.

The method of recognizing touch can be applied on all kinds of mutual-inductance capacitive touch panels. Referring to FIG. 1, a mutual-inductance capacitive touch panel comprises a driving layer 12, a sensing layer 14, and an IC. The IC is electrically connected with the driving layer 12 and the sensing layer 14. The driving layer 12 is spaced from and opposite to the sensing layer 14.

The driving layer 12 comprises a plurality of driving electrodes 120. The plurality of driving electrodes 120 are spaced from each other and extend along an X direction. The sensing layer 14 comprises a plurality of sensing electrodes 140. The plurality of sensing electrodes 140 are spaced from each other and extend along a Y direction. The X direction is substantially perpendicular to the Y direction. The plurality of sensing electrodes 140 are insulated with and intersect with the plurality of driving electrodes 120. A plurality of mutual-inductance capacitances can be formed between the plurality of sensing electrodes 140 and the plurality of driving electrodes 120. In one embodiment, the plurality of sensing electrodes 140 are parallel with each other, the plurality of driving electrodes 120 are parallel with each other, and the plurality of sensing electrodes 140 and the plurality of driving electrodes 120 are strip-shaped electrodes. Material of the plurality of sensing electrodes 140 and the plurality of driving electrodes 120 can be indium tin oxide or carbon nanotube.

The plurality of driving electrodes 120 are labeled by m in order. The m is a natural number. The IC comprises a driving IC and a sensing IC. The driving IC is electrically connected with the plurality of driving electrodes 120. The driving IC is used to provide driving signals to the plurality of driving electrodes 120. The sensing IC is electrically connected with the plurality of sensing electrodes 140. The plurality of sensing electrodes 140 are used to detect signal values via the plurality of sensing electrodes 140.

Figure 2:
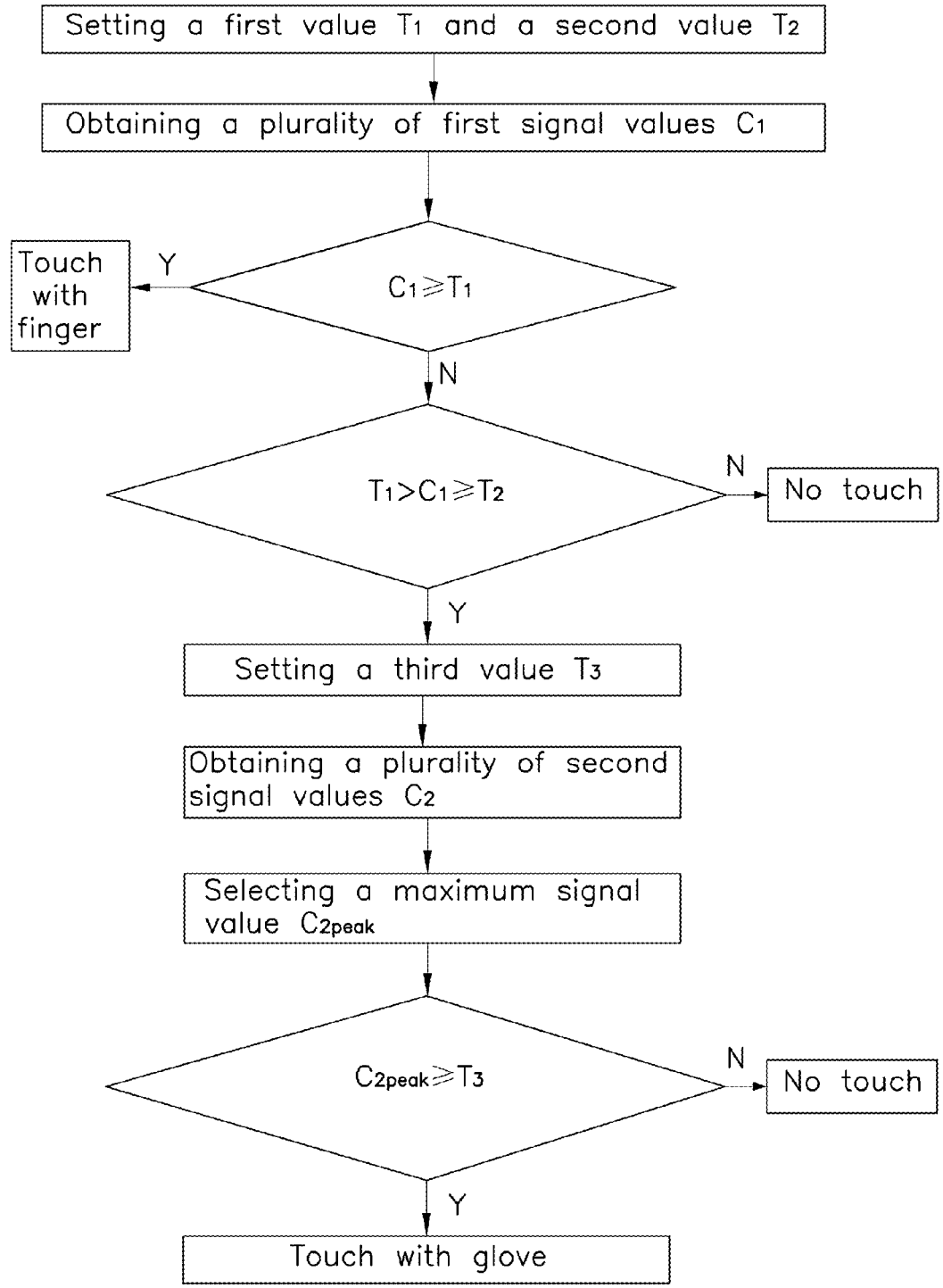
FIG. 2 is a flowchart of a method of recognizing touch on a touch panel.

Referring to FIG. 2, the method of recognizing touch comprises following steps:

S1, setting a first value $T_1$ and a second value $T_2$, wherein the second value $T_2$ is smaller than the first value $T_1$;

S2, driving the plurality of driving electrodes 120 one by one, sensing touch signals and obtaining a plurality of first signal values $C_1$;

S3, comparing the plurality of first signal values $C_1$ with the first value $T_1$ and the second value $T_2$, when the plurality of first signal values $C_1$ is greater than or equal to the first value $T_1$, recognizes as a touch with finger; when the plurality of first signal values $C_1$ is smaller than the second value $T_2$, recognizes as no touch; when the plurality of first signal values $C_1$ is greater than or equal to the second value $T_2$ and smaller than the first value $T_1$, takes the following steps;

S4, setting a third value $T_3$;

S5, driving the plurality of driving electrodes 120 several times and sensing a plurality of second signal values $C_2$, wherein an n is defined as a sequence of driving, at least adjacent three of the plurality of driving electrodes 120 of labeling n, n+1, and n+2, are driven simultaneously each time;

S6, selecting a maximum signal value $C_{2peak}$ from the plurality of second signal values $C_2$, and comparing the maximum signal value $C_{2peak}$ with the third value $T_3$, when the maximum signal value $C_{2peak}$ is greater than or equal to the third value $T_3$, recognizes as a touch with glove; and when the maximum signal value $C_{2peak}$ is less than the third value $T_3$, recognizes as no touch.

In step (S1), the first value $T_1$ can be a threshold value of sensing signal of traditional capacitive touch panel. In one embodiment, a maximum signal value is sensed by the sensing IC when the finger completely contacts the touch panel, the first value $T_1$ is defined as one fifth to one third times of the maximum signal value.

In one embodiment, the second value $T_2$ is greater than a background signal value. The background signal value is a parasitic capacitance with no touch. The background signal value is caused by conductive wires connecting with the IC.

In step (S2), the plurality of first signal values $C_1$ is a difference value between signal values at one position of the touch panel when the touch panel is touched and not touched.

In step (S3), when the plurality of first signal values $C_1$ is smaller than the first value $T_1$, the plurality of first signal values $C_1$ are further compared with the second value $T_2$ in order to recognize whether it is no touch or a touch with glove, and not to be recognized as no direct touch. The touch with glove means an insulator such as the glove exists between the screen of touch panel and the finger. When the plurality of first signal values $C_1$ is smaller than the second value $T_2$, it is determined that the finger has a long distance with the screen of the touch panel or a background signal is recognized. When the plurality of first signal values $C_1$ is greater than or equal to the second value $T_2$ and smaller than the first value $T_1$, it is further determined whether it is a touch with glove.

"False touch" means that the finger does not touch the screen actually and is just near the screen. When the distance between the screen and the finger is about a thickness of the glove, the sensing IC would sense this "false touch." If the touch is the "false touch", the finger could not keep static during the time period and would move away from the screen. Therefore, following substeps (S31) to step (S34) are further taken before step (S4) in order to prevent recognizing as the "false touch":

S31, setting a time period;

S32, driving the plurality of driving electrodes 140 several times and sensing a plurality of third signal values $C_1'$ during the time period;

S33, selecting a maximum signal value $C_{1peak}$ from the plurality of third signal values $C_1'$ of each time to obtain a plurality of maximum signal values $C_{1peak}$, and calculating an averaged signal values $\overline{C_{1peak}}$ of the plurality of maximum signal values $C_{1peak}$, when the plurality of maximum signal values $C_{1peak}$ satisfy following formula: $0.8\ \overline{C_{1peak}} \leq C_{1peak} \leq 1.2\ \overline{C_{1peak}}$, taking the step (S4) to step (S6); and when the plurality of maximum signal values $C_{1peak}$ does not satisfy the formula: $0.8\ \overline{C_{1peak}} \leq C_{1peak} \leq 1.2\ \overline{C_{1peak}}$, recognizes as no touch.

In step (S31), the time period ranges from one second to four seconds.

In step (S32), the plurality of driving electrodes 140 is driven one by one each time.

In step (S33), the touch can be two types of fixing and sliding. The fixing touch means the finger touches on a same position during the time period, and the plurality of maximum signal values $C_{1peak}$ are equivalent. The sliding touch means the finger moves on the screen during the time period, and the plurality of maximum signal values $C_{1peak}$ change with touching positions.

When the finger touches a position of one of the plurality of sensing electrodes 140, the signal value is great; when the finger touches a position between adjacent two of the plurality of sensing electrodes 140, the signal value is small. Therefore, the maximum signal values $C_{1peak}$ of several times are obtained and the averaged signal values $\overline{C_{1peak}}$ of the plurality of maximum signal values $C_{1peak}$ of several times are calculated.

In step (S4), the third value $T_3$ is defined as one and a half to two and a half times of the second value $T_2$.

Figure 3:
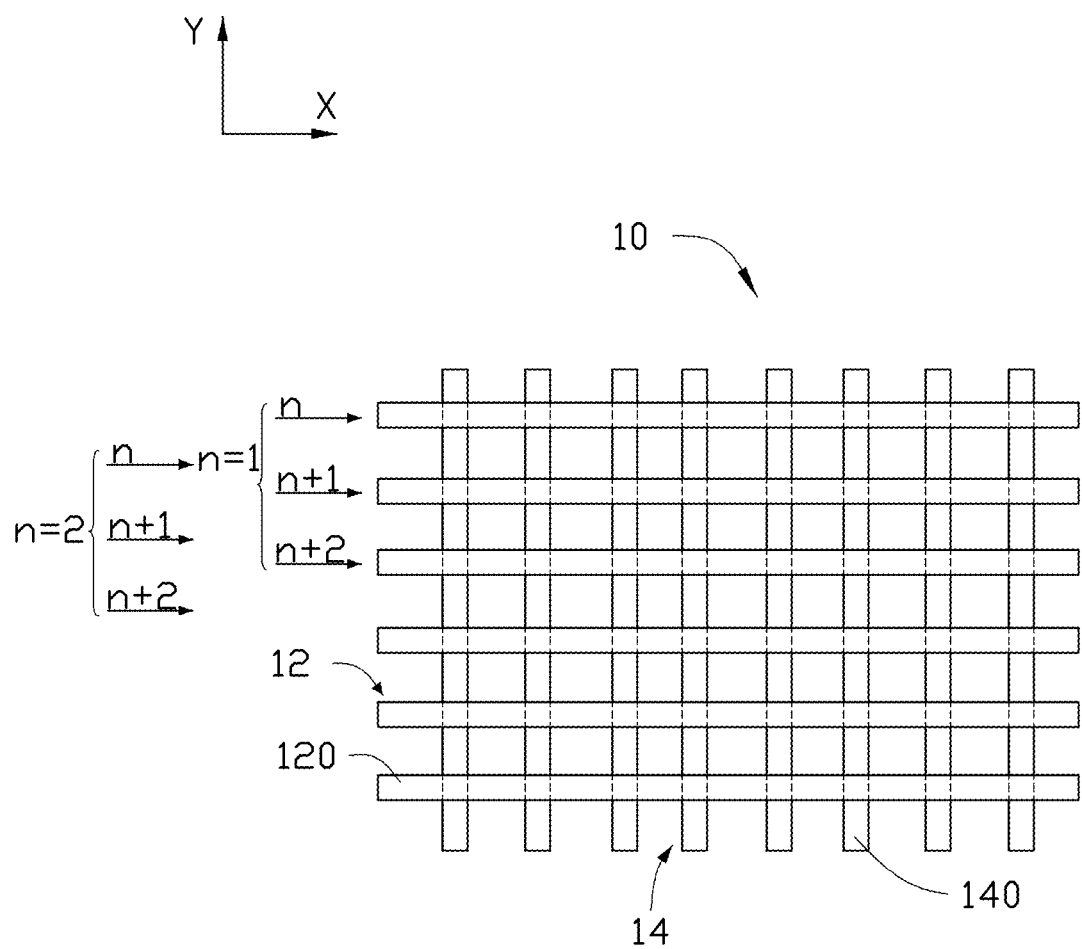
FIG. 3 is a structure view of a touch panel on working.

In step (S5), referring to FIGS. 3 and 4, the at least adjacent three of the plurality of driving electrodes 120 of labeling n, n+1, and n+2, are driven simultaneously each time. Thus, a bigger signal value could be obtained. In one embodiment, when a first driving is taken, the n is 1, driving electrodes 120 of labeling 1, 2, and 3 are driven simultaneously; when a second driving is taken, the n is 2, driving electrodes 120 of labeling 2, 3, and 4 are driven simultaneously. The plurality of second signal values $C_2$ are difference values between signal values at one position of the touch panel when the touch panel is touched and not touched.

In step (S6), when the maximum signal value $C_{2peak}$ is smaller than the third value $T_3$, it is determined that the finger has a long distance with the screen or the background signal is recognized. When the maximum signal value $C_{2peak}$ is greater than or equal to the third value $T_3$, it is determined as the touch with glove.

The method of recognizing touch has the advantage of recognizing both the touch with finger and the touch with glove. Some other errors of recognizing touch can be eliminated.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A method of recognizing touch on a touch panel, wherein the touch panel comprises a plurality of sensing electrodes and a plurality of driving electrodes, and the method comprising:

setting a first value $T_1$ and a second value $T_2$, wherein the second value $T_2$ is smaller than the first value $T_1$;

driving the plurality of driving electrodes one by one, sensing touch signals and obtaining a plurality of first signal values $C_1$;

comparing the plurality of first signal values $C_1$ with the first value $T_1$ and the second value $T_2$, when the plurality of first signal values $C_1$ is greater than or equal to the first value $T_1$, recognizes as a touch with finger; when the plurality of first signal values $C_1$ is smaller than the second value $T_2$, recognizes as no touch; and when the plurality of first signal values $C_1$ is greater than or equal to the second value $T_2$ and smaller than the first value $T_1$, takes the following steps;

setting a third value $T_3$;

driving the plurality of driving electrodes several times and sensing a plurality of second signal values $C_2$, wherein an n is defined as the sequence of driving, at least adjacent three of the plurality of driving electrodes of labeling n, n+1, and n+2, are driven simultaneously each time; and selecting a maximum signal value $C_{2peak}$ from the plurality of second signal values $C_2$, and comparing the maximum signal value $C_{2peak}$ with the third value $T_3$, when the maximum signal value $C_{2peak}$ is greater than or equal to the third value $T_3$, recognizes as a touch with glove; and when the maximum signal value $C_{2peak}$ is less than the third value $T_3$, recognizes as no touch.

2. The method of claim 1, wherein the first value $T_1$ is defined as one fifth to one third times of a maximum signal value of sensing when a finger completely contacts the touch panel.

3. The method of claim 1, wherein the second value $T_2$ is greater than a background signal value.

4. The method of claim 1, wherein the third value $T_3$ is one and a half to two and a half times of the second value $T_2$.

5. The method of claim 1, further comprising following steps before setting the third value $T_3$:
   setting a time period;
   driving the plurality of driving electrodes several times and sensing a plurality of third signal values $C_1'$ during the time period; and
   selecting a maximum signal value $C_{1peak}$ from the plurality of third signal values $C_1'$ of each time to obtain a plurality of maximum signal values $C_{1peak}$, and calculating an averaged signal values $\overline{C_{1peak}}$ of the plurality of maximum signal values $C_{1peak}$, when the plurality of maximum signal values $C_{1peak}$ satisfy following formula: $0.8 \overline{C_{1peak}} \leq C_{1peak} \leq 1.2 \overline{C_{1peak}}$, going to the step of setting the third value $T_3$; and when the plurality of maximum signal values $C_{1peak}$ does not satisfy the formula: $0.8 \overline{C_{1peak}} \leq C_{1peak} \leq 1.2 \overline{C_{1peak}}$ t, recognizes as no touch.

6. The method of claim 5, wherein the time period ranges from one second to four seconds.

\* \* \* \* \*